United States Patent [19]

Quarton et al.

[11] 4,039,784

[45] Aug. 2, 1977

[54] DIGITAL MINIMUM/MAXIMUM VECTOR CRT DISPLAY

[75] Inventors: William T. Quarton; Peter R. Lowe, both of Englewood, Colo.

[73] Assignee: Honeywell Inc., Minneapolis, Minn.

[21] Appl. No.: 653,725

[22] Filed: Jan. 30, 1976

[51] Int. Cl.$^2$ .................... G06F 15/20; G01R 19/30
[52] U.S. Cl. ............................ 235/151; 324/103 R; 340/324 A
[58] Field of Search ............... 235/151, 152, 198; 324/103 R, 103 P, 121 R; 346/110 R; 340/324 A, 347 AD; 315/365, 367, 379, 384

[56] References Cited

U.S. PATENT DOCUMENTS

| | | | |
|---|---|---|---|
| 3,665,410 | 5/1972 | Holland | 340/324 A X |
| 3,733,601 | 5/1973 | Oliver | 324/103 R |
| 3,878,984 | 4/1975 | Sotiropoulos et al. | 324/103 P |
| 3,924,078 | 12/1975 | Bussey | 324/103 P |
| 3,973,197 | 7/1974 | Meyer | 324/103 P |

*Primary Examiner*—Joseph F. Ruggiero
*Attorney, Agent, or Firm*—Laurence J. Marhoefer; Lockwood D. Burton

[57] ABSTRACT

A vector CRT display apparatus for faithfully reproducing an analog signal having high frequency components include an A-D converter, a digital minimum/maximum circuit and a recirculating shift register to derive from the signal, in successive sampling periods, two digital words representing, respectively, a minimum amplitude value date point and a maximum amplitude value data point of the signal. In each sampling period, the minimum/maximum circuit stores in the memory the most relevant of the minimum and maximum amplitude values and determine whether the remaining values should be held over to the next sampling period before it is stored, or can be discarded. As a result, if new minimum and new maximum amplitude values occur in the same sample period, one will be loaded into the memory and the other will be held over and loaded into the memory in the next sample period. By storing only the most relevant of the minimum and maximum amplitude values, the size of the memory required, and its cost are substantially reduced; additionally, the storage of only important values in the memory for later display contributes to a uniformity of brightness of the display.

12 Claims, 9 Drawing Figures

DIGITAL MINIMUM/MAXIMUM VECTOR CRT DISPLAY

Subject matter disclosed in this application but not claimed herein is disclosed and is being claimed in the copending application of Peter R. Lowe and William T. Quarton, Ser. No. 624,905, filed on Oct. 22, 1975.

BACKGROUND OF THE INVENTION

1. Field of the Invention

This invention relates to the production of visual displays of time dependent measured quantities, for example, analog physiological signals. The invention is concerned particularly with the display by a cathode ray tube (CRT) of high frequency signals with minimum information, which display is produced on the basis of intermittently obtained values or samples which represent successive amplitude conditions or values of the signals. The invention features the use of digital techniques and is characterized by uniformity of brightness of the display and in a requirement for minimum memory.

2. Description of the Prior Art

Analog and digital apparatus for making visible graphs of analog time dependent measured quantities are known in the prior art. One such known form of analog apparatus is disclosed in the copending application bearing Ser. No. 550,984, filed Feb. 19, 1975 by Peter R. Lowe and Tommy N. Tyler. That apparatus yields faithful reproduction of high frequency signals notwithstanding the intermittent nature of the sampled data used as the information from which the display is produced. In effecting such display, that apparatus produces a succession of parallel line segments representative of the minimum to the maximum excursion of the data or input signal from a sampling period preceding the display period. This result is achieved by the use of a pair of amplitude-detector type circuits which are arranged (a) to store the minimum and maximum excursion of an input analog signal, (b) to supply their respective outputs to comparator circuits, and (c) to be reset to zero upon command. The said circuits are operative in complementary manner, during successive alternate periods, to store the minimum and the maximum values of the data signal and to present the stored values to the comparators for unblanking a CRT. Each such period corresponds to the duration of a sweep of the cathode ray tube beam. As a result of alternating between the amplitude-detector circuits, the minimum and maximum vaulues of the data signal during each sweep and retrace periods of the CRT are always detected and stored by one or the others of the detectors. Transient peak and valley information contained in the data signal, including signal envelopes of high frequency signals, is displayed, and the loss of data is minimized. That apparatus, however, is a recording apparatus in which the CRT is operated in a so-called line scan mode.

A form of digital CRT display apparatus for making visible analog time dependent quantities is shown in U.S. Pat. No. 3,653,027 granted on Mar. 28, 1972 to David W. Scheer. That apparatus includes an analog to digital converter as well as a CRT display device. The memory and the CRT display device are synchronized so that a bright spot representative of the information contained in one location of the memory is produced on the CRT display device for each shifting of information in the memory. New information may be made to replace existing information in the memory at a rate less than the shifting rate of the memory whereby the display trace appears to move across the viewing of the screen of the CRT with a constant brightness. With that prior digital apparatus, as long as the analog signal or signals being measured are slewing in one direction or the other, there is little or no error in the graphic representation of the signal or signals. If the signals should undergo a very rapid or abrupt change of direction between sampled periods, however, significant peak errors can occur, in that such peaks will not be indicated or recorded. Thus, the prior digitial display apparatus described in inadequate for displaying abruptly changing or transient data, or for displaying signal envelopes of high frequency signals.

SUMMARY OF THE INVENTION

Accordingly, it is an object of the present invention to provide an improved digital apparatus for providing a faithful reproduction of the amplitude variations of analog time dependent measured quantities notwithstanding the intermittent nature of the sampled data used as the information from which the display is produced, and the presence of high frequency transients in said measured quantities.

In accomplishing these and other objects, the apparatus of the present invention departs from the techniques employed in the prior art apparatus by storing in the digital memory, in each sampled period, only the important amplitude value, that is, the minimum or the maximum, of the time dependent measured quantity sensed in that sampled period, noting, however, whether the remaining other value for that sampling period is of interest or can be discarded. To this end, the apparatus of the present invention includes a circuit, for convenience designated a minimum/maximum circuit, which is operative to determine in each sample period (a) which of two sampled measured or data points, amplitude value, the minimum or the maximum amplitude value, is the most relevant, and should be stored in a memory to provide a faithful reproduction of the variations in amplitude with time of the measured quantity, and (b) whether the remaining value needs to be retained or can be discarded. If it is determined that the remaining data point contains useful information, it is held over to the next sampling period before it is stored. In other words, if both a new minimum and a new maximum value should occur in the same sample period, one will be loaded into the memory and the other will be held over and loaded in the memory in the next sample period.

By storing only the important value required for a faithful reproduction of the measured quantity, the size of the memory required, and its cost, may be substantially reduced. The invention is further characterized in that since only important values are stored in the memory for later display, uniformity of brightness of the display is enhanced.

BRIEF DESCRIPTION OF THE DRAWINGS

A better understanding of the present invention may be had from the following detailed description when read in connection with the accompanying drawings wherein.

DESCRIPTION OF THE PREFERRED EMBODIMENT

Figure 1A:
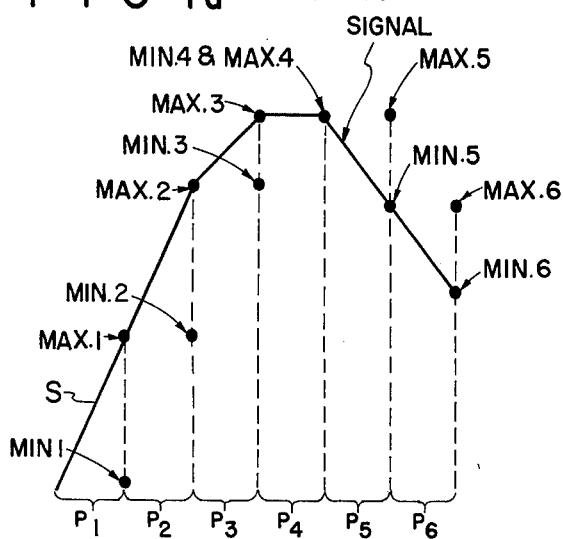
FIG. 1a and 1b are representations which illustrate the nature of the curves produced by the known type of prior art digital apparatus.
Figure 1B:
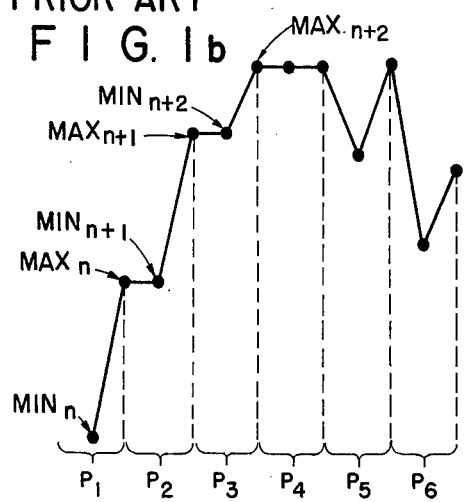
Figure 1C:
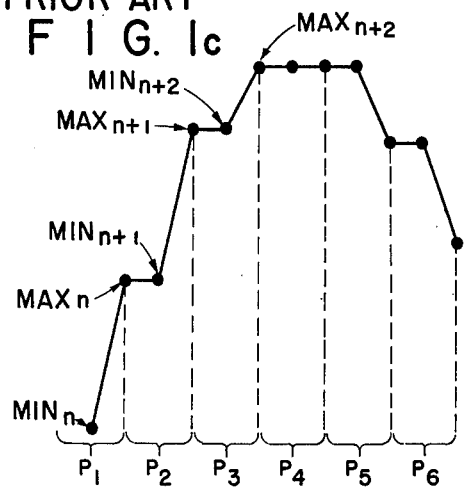
FIG. 1c is a representation which illustrates the nature of the curves produced by a novel manner of plotting.

THE APPARATUS OF FIGS. 1a, 1b AND 1c

In the prior art apparatus for recording transient peak and valley, or maximum and minimum, information contained in high frequency data signals, the principle generally employed is to find the minimum and maximum values over one sample period and then to simply gate on the beam of a recording CRT operated in a line scan mode when the beam is deflected between the sensed minimum and maximum values. Such apparatus, as shown in the above-mentioned application Ser. No. 550,984, has the desirable feature of being operative to display high frequency signals with minimum information. Problems occur, however, when the display CRT device is not operated in the line scan mode but instead is X-Y or vector controlled as a result of which the beam proceeds directly from one data point to the next. That is to say, two general types of CRT display devices are known in the art. One is so-called raster scan or repetitive line scan display, as disclosed in said application Ser. No. 550,984. The other is an X-Y or vector display, as illustrated in application Ser. No. 624,905. The prior art solution of said application Ser. No. 550,984 for displaying maximum and minimum information of high frequency or transient signals is not practically suitable for X-Y or vector scan display apparatus.

With respect to the problems that occur when the display device is not raster scan operated but instead is X-Y controlled, reference is made to FIGS. 1a, 1b, and 1c. In FIG. 1a, it will be seen that for each sample period, designated respectively $P_1$, $P_2$, $P_3$, $P_4$, $P_5$, and $P_6$, there is one minimum value and one maximum value data point. An inermediate problem with respect to the operation of a visual display CRT, however, is which data point, the minimum or the maximum value, should the CRT plot first. In a raster line scan device, a vertical line is drawn between them. This results in the final plot being composed of a plurality of very closely spaced fine parallel and, typically, vertical lines. In a vector plotting type of CRT display apparatus, however, the visual display is produced by suitably deflecting the CRT electron beam along the Y axis from a first data point $Y_n$, for example, to a second daa point, $Y_{n+1}$, while suitably and slowly deflecting the beam along the X axis to represent the time base.

By reference to FIG. 1b, consider the minimum and maximum data points shown. Each pair of minimum and maximum points represents the values obtained in a sample period. There is a question, however, as to how a vector plotting CRT display device should connect the minimum and maximum data points. It will be noted that in FIG. 1b the data points shown are identical to those illustrated in FIG. 1a. FIG. 1b shows what happens, however, if the plotting is effected by proceeding from data points $MIN_n$ to $MAX_n$, $MAX_n$ to $MIN_{n+1}$, $MIN_{n+1}$ to $MAX_{n+1}$, . . . . On an up slope, the display is correct inasmuch as the minimum values occur before the maximum values. On a down slope, for example, during sample periods $P_5$ and $P_6$, however, the trace produced does not faithfully represent the signal S. This is because on a down slope the maximum values occur before the minimum values, and yet, for faithful reproduction, the display must be effected the opposite way.

FIG. 1c illustrates a display procedure for avoiding the problems inherent in the procedure illustrated in FIG. 1b. The procedure shown in FIG. 1c, for convenience is referred to as FIFO (first in first out). Here again, the minimum and maximum data points illustrated are identical to those shown in FIG. 1a and represent sampled data points obtained from the curve S.

By reference to FIG. 1c, if a minimum value occurs before a maximum value on the data signal S, the minimum value is outputted first, and vice-versa. While this display procedure is operative, its essential character is such as to pose a problem. It will be noted that on an up slope, the maximum value sampled data point $MAX_n$ is the same point as the minimum value sampled data point $MIN_{n+1}$. When displayed on a vector CRT visual display device, the beam will be caused to move the relatively long Y or vertical distance from the data point $MIN_n$ to the data point $MAX_n$. The vertical movement of the beam will then be stopped, although the X or horizontal movement will continue at a predetermined slow rate, the time base, for the display of the vector from the data point $MAX_n$ to $MIN_{n+1}$. Since the brightness of the display is proportional to the rate of beam movement, when the beam stops or slows for the display of the vector from $MAX_n$ to $MIN_{n+1}$, a bright dot is caused to appear on the screen of the CRT. As a result, the display trace produced on the said screen will be composed of a string of bright dots connected by long vectors.

There is also another problem where the information as to the minimum and maximum sampled valued data points are stored in digital memory. As noted above, on an up slope, the maximum value of a data point in a first sample period is equal to the minimum value in the immediately following sample period, that is $MAX_n$ equals $MIN_{n+1}$. Thus, if both $MAX_n$ and $MIN_{n+1}$ are both stored, more information is stored than is really necessary. If only the relevant information were stored, a memory half the size would serve the purpose and thus reduce the memory cost by one-half.

In solving these two problems, the method and apparatus according to the present invention utilizes a minimum/maximum circuit including a complex data sorter to the end that in each sample period only the important value, the minimum value or the maximum value, is stored. The data sorter is required, however, to decide if the remaining other value is of interest. In FIG. 1c, it will be seen that the remaining value can be discarded since it is redundant.

Figure 2A:
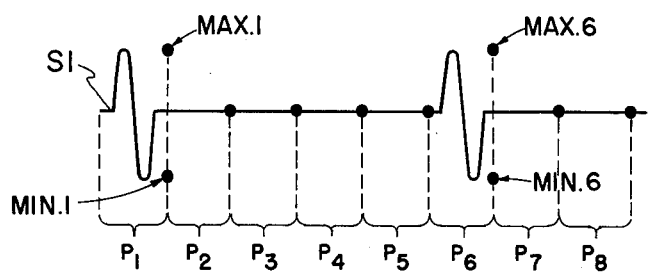
FIGS. 2a and 2b are representations which illustrate the nature of the signals sensed and curves produced according to the method and apparatus of the present invention.
Figure 2B:
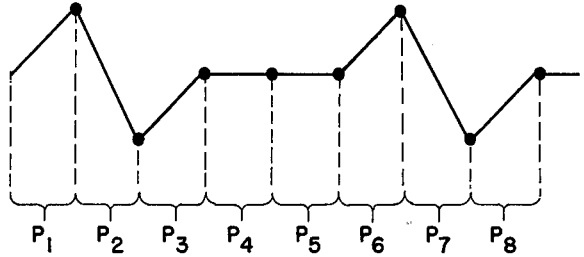

FIGS. 2a and 2b illustrate a situation in which both the minimum value and the maximum value sampled data points are of interest. It is noted, in this connection, that the signal S illustrated in FIGS. 1a, 1b and 1c was not a high frequency signal and that half the data the minimum/maximum circuit was creating was redundant and could be discarded. In FIG. 2a, however, a high frequency transient occurs in the signal designated $S_1$ during the sample period indicated as $P_1$ and, hence, both the minimum and maximum values are important. Thus, the circuit according to the present invention is arranged to determine (a) which one of the two data points, the minimum or the maximum value, is the most relevant and requires storage, and (b) if the remaining value can be discarded, or needs to be retained. If the remaining data point contains useful information, as illustrated in FIG. 2a, it is held over to the next sample period, and then it is stored.

FIG. 2b is illustrative of a display of the sampled data points shown in FIG. 2a produced according to the apparatus of the present invention. Notice by reference to FIG. 2b that the two relevant maximum and minimum data points obtained in sample period $P_1$ are displayed in periods $P_1$ and $P_2$. Thus, if new minimum and maximum values occur in the same sample periods, the first to occur will be loaded into the memory in that period, and the other will be held over and loaded into the memory in the next sample period.

Figure 3:
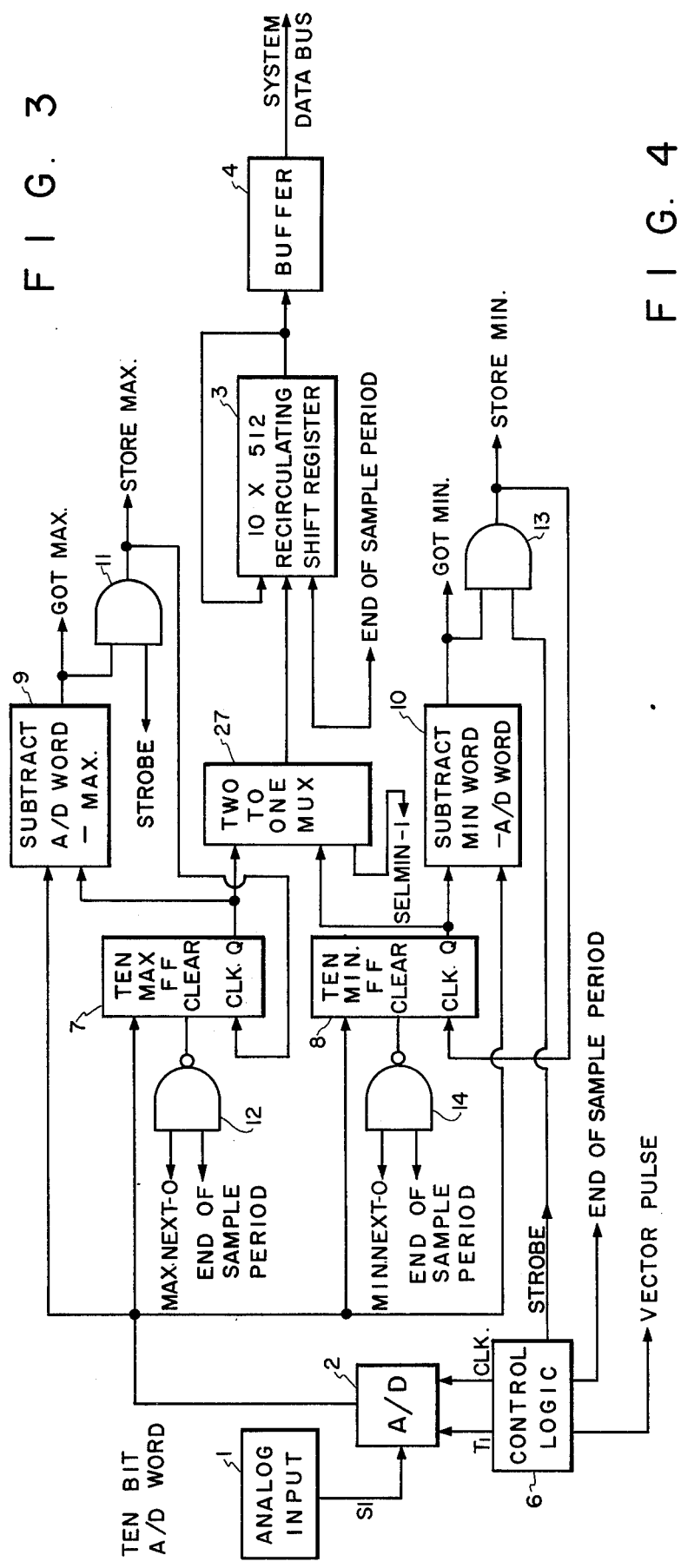
FIGS. 3 and 4 are block diagrams that collectively illustrate the minimum/maximum circuit of a single channel vector plotting type of display-producing apparatus according to a preferred embodiment of the present invention, employing the novel method thereof.
Figure 4:
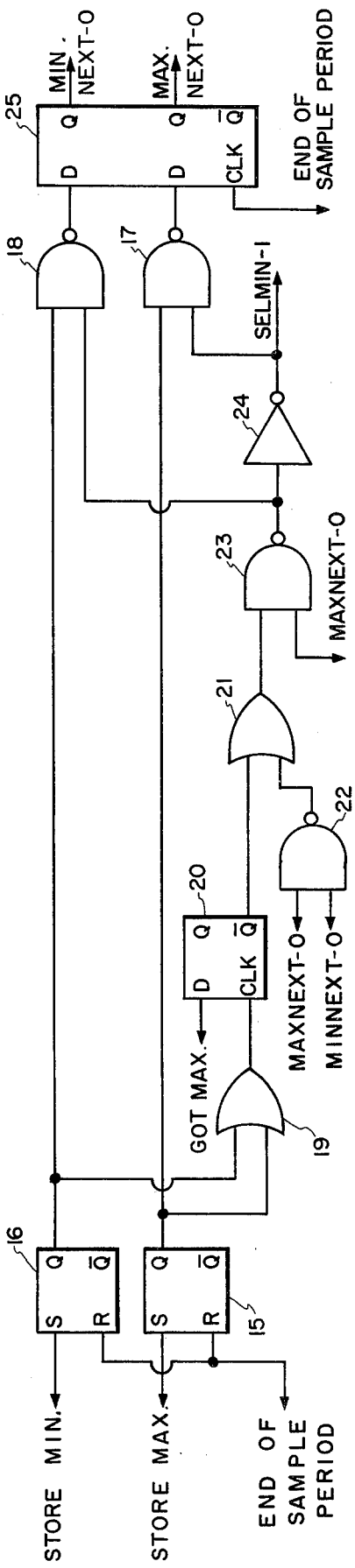

THE APPARATUS OF FIGS. 3 and 4

Figure 5:
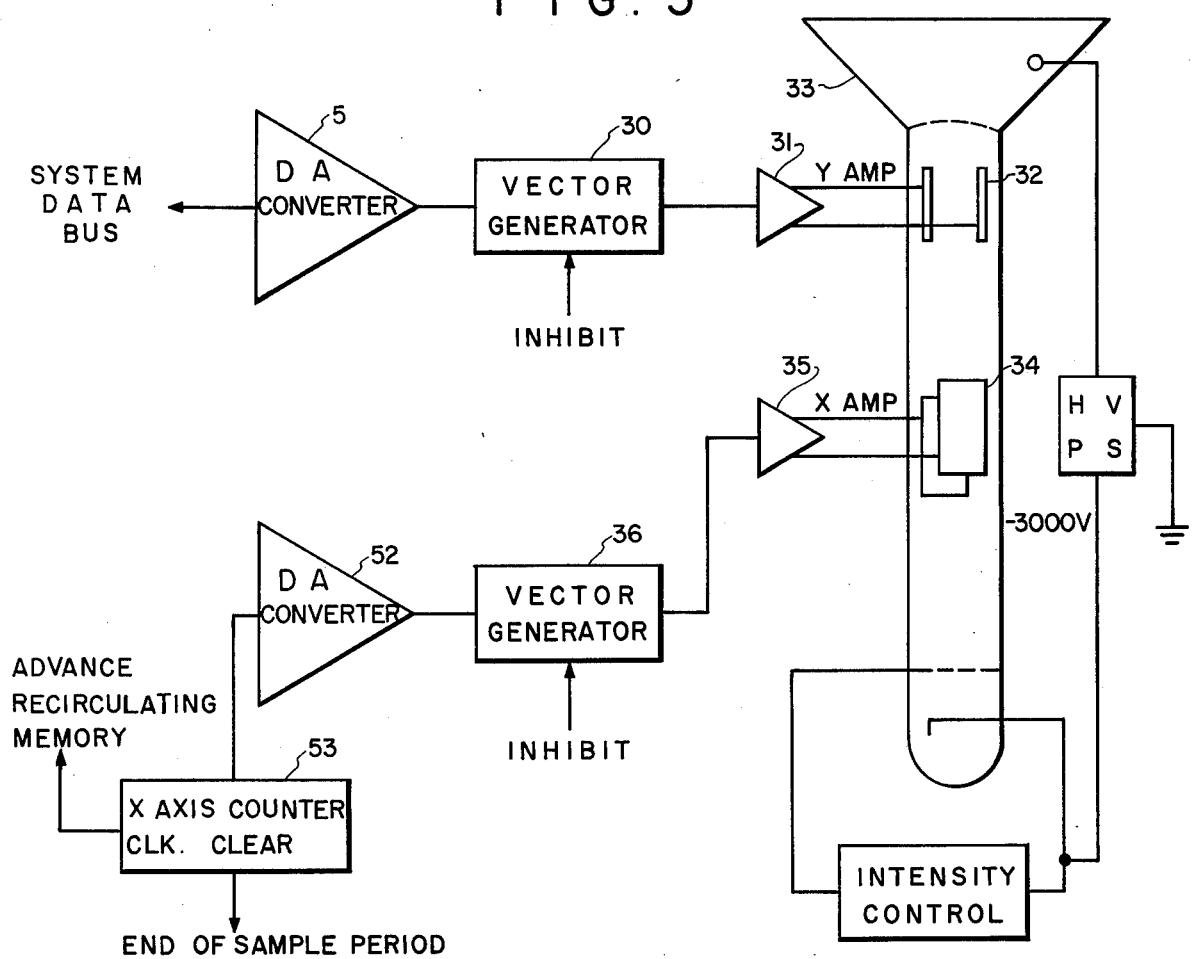
FIG. 5 is a diagram of a vector plotting type of display apparatus that is used with the minimum/maximum circuitry of FIGS. 3 and 4.

An anaolog signal to be displayed, for example, a high frequency physiological signal derived from a sensing device shown at 1, is applied to an input terminal of an analog to digital (A-D) converter 2. The A-D converter 2 has 10 output lines which are connected by the minimum/maximum data sorting circuitry of FIGS. 3 and 4 to the input of a recirculating memory means indicated at 3. The recirculating memory means 3, in turn, has ten output lines which are directly connected to ten input terminals of a suitable buffer indicated at 4. The ten output lines of the buffer 4 are connected to the input of a digital to analog (D-A) converter 5, as seen in FIG. 5. The operation of the D-A converter 5 and the construction and operation of the apparatus of FIG. 5 is explained further hereinafter.

As seen in FIG. 3, a timing and control logic circuit 6 supplies two input control signals to the A-D converter 2 and also supplies three input control signals to the minimum/ maximum circuitry. The latter signals are designated "STROBE", "END OF SAMPLE PERIOD", and "VECTOR PULSE".

The ten lines or 10 bit digital word at the output of the A-D converter 2 are applied to the input of the minimum/maximum circuit and are compared against previous minimum and maximum values stored in two sets of ten flip-flops indicated respectively at 7 and 8. The 10 bit digital word from the output of the A-D converter 2 is applied to the inputs of two SUBTRACT circuits indicated at 9 and 10. Each of said SUBTRACT circuits includes two sets of inputs and one output.

The SUBTRACT circuit 9 is arranged to effect a subtraction of the digital word, a maximum value, then stored in the flip-flops 7 from the digital word then coming in from the A-D converter 2. To that end, the Q output terminals of flip-flops 7 are connected to a second set of input terminals of the SUBTRACT circuit 9. Similarly, the SUBTRACT circuit 10 is arranged to effect a subtraction of the A-D word currently coming in from the A-D converter 2, from the A-D word, a minimum value, then stored in the flip-flops 8. To that end, the Q outputs of flip-flops 8 are connected to another set of inputs of the SUBTRACT circuit 10.

As a result of the subtraction operation which is effected for each of the many digital words outputted from the A-D converter 2, the SUBTRACT circuits 9 and 10 develop output signals representative, respectively, of new maximum, identified as "GOT MAX" and a new minimum, identified as "GOT MIN".

The output terminal of the SUBTRACT circuit 9, as seen in FIG. 3, is connected to the terminal designated GOT MAX, and also to one input terminal of an AND gate 11 the other terminal of which is connected to the STROBE output of the timing and control logic circuitry 6. The output terminal of the AND gate 11 is connected to a terminal designated "STORE MAX", and also to a clock input terminal of the flip-flops 7. A "clear" input terminal of the flip-flops 7 is connected to the output terminal of a NAND gate 12. One input terminal of the NAND gate 12 is connected to the END OF SAMPLE PERIOD output terminal of the circuit 6. The other input terminal of NAND gate 12 is connected to a terminal designated "MAXNEXT - 0".

Similarly, the output terminal of the SUBTRACT circuit 10 is connected to a terminal designated GOT MIN, and to one input terminal of an AND gate 13. The other input terminal of gate 13 is connected to the STROBE output terminal of circuitry 6. The output terminal of AND gate 13 is connected to a terminal designated STORE MIN, and to a clock input terminal of the flip-flops 8. A Clear terminal of the latter is connected to the output terminal of a NAND gate 14. One input terminal of the latter is connected to the END OF SAMPLE PERIOD output terminal of circuit 6. The other input terminal of NAND gate 14 is connected to an output terminal designated "MINNEXT - 0".

FIG. 4 illustrates a circuit that controls the minimum/maximum circuitry of FIG. 3. Specifically, FIG. 4 shows a circuit that controls which of the two data points, the minimum or maximum value, in each sample period, that is loaded into the recirculating memory 3. As shown, the circuit of FIG. 4 includes two R-S type flip-flops 15 and 16. The set or S input terminal of flip-flop 15 is connected to the STORE MAX output terminal of the AND gate 11. Similarly, the set of S input terminal of flip-flop 16 is connected to the STORE MIN output terminal of the AND gate 13. The reset or R terminals of the flip-flops 15 and 16 are both connected to the END OF SAMPLE PERIOD terminal of the timing and control logic circuit 6.

The Q output terminal of the flip-flop 15 is connected to an input terminal of a NAND gate 17. Similarly, the Q output terminal of flip-flop 16 is connected to an input terminal of a NAND gate 18. The said Q output terminal of the flip-flop 15 is also connected to a respectively associated input terminal of an OR gate 19. The Q output terminal of flip-flop 16 is connected to another input terminal of OR gate 19. The output terminal of gate 19 is connected to the clock input terminal of a D-type latch 20. The D input of the latch 20 is connected to the GOT MAX output terminal of the SUBTRACT circuit 9. The $\overline{Q}$ output terminal of the latch 20 is connected to an input terminal of an OR gate 21. Another input terminal of gate 21 is connected to the output of a NAND gate 22. One input terminal of NAND gate 22 is connected to the MAXNEXT - 0 output terminal of the D-type flip-flop 25. The other input terminal of NAND gate 22 is connected to the MINNEXT - 0 output terminal of the D-type flip-flop 25. The output terminal of the OR gate 21 is connected to one input terminal of a NAND gate 23, the other input terminal of which is connected to the MAXNEXT - 0 output terminal of the D-type flip-flop 25. The output terminal of the NAND gate 23 is connected to a second input terminal of the NAND gate 18, and also is connected to the input of an inverter 24. The output of the latter is connected to the second input of the NAND gate 17.

The output terminal of the NAND gate 17 is connected to a first D input of a D-type flip-flop 25. A Q output associated with said first D input of latch 25, designated MAXNEXT - 0, is connected to the similarly designated input terminal of the NAND gate 12 of FIG. 3. The output terminal of NAND gate 18 is connected to a second input of a latch 25. A Q output of latch 25, designated MINNEXT, and associated with said second D input, is connected to the similarly designated input of the NAND gate 14 of FIG. 3. The clock input of the latch 25 is connected to the END OF SAMPLE PERIOD output of circuit 6.

Referring now to FIG. 3, it is seen that the Q outputs of flip-flop 7 are connected to one set of input terminals of a 2 to 1 multiplexer indicated at 27. The multiplexer 27 has a second set of input terminals to which the Q outputs of flip-flops 8 are connected, and a third input terminal to which the output, identified as SELMIN - 1 of inverter 24, is connected. The outputs of multiplexer 27 are connected to the input of recirculating memory 3. The END OF SAMPLE PERIOD terminal of the control logic circuit 6 is connected to the input of recirculating memory 3. The output of the latter, as previously noted, is connected by way of the buffer 4 to the input of the D-A converter 5, as seen in FIG. 5. The output of the D-A converter 5 is connected to the input of a vector generator 30. The output of the latter is connected to the input of an amplifier 31, the output of which, in turn, is connected to drive the Y deflection plates 32 of a CRT 33. CRT 33 also includes X deflection plates 34 which are driven by an amplifier 35.

Figure 6:
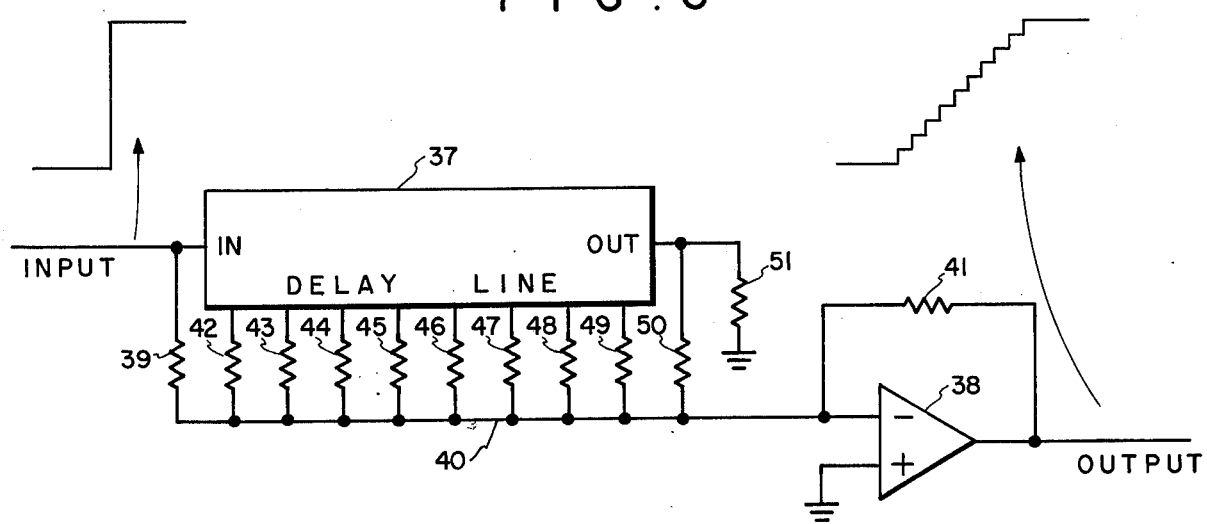
FIG. 6 is a diagram illustrating the circuit of the vector generators of FIG. 5.

FIG. 6 is a diagram illustrating the circuit of the vector generators 30 and 36 of the FIG. 5 apparatus. Each of the vector generators is so designed that an analog voltage step input to the generator will cause an output voltage which proceeds between the step levels in staircase fashion.

Each of the generators includes a delay line 37, and an operational amplifier 38. The delay line 37 has an input terminal and nine output tap terminals. In the case of the generator 30, the input terminal is connected to the output of the D-A converter 5. In the case of the vector generator 36, the input terminal is connected to the output of a D-A converter 52. The input of the latter is connected to the output of an X-axis counter 53 which is clocked by an ADVANCE RECIRCULATING MEMORY, not shown. The counter 53 has a clear connection to the END OF SAMPLE PERIOD terminal.

In each case, the input terminals of the vector generators 30 and 36 are connected by a resistor 39 to a summing line 40. The latter is connected to the inverting input terminal of operational amplifier 38. The input terminal of the amplifier 38 is also connected by a resistance 41 to the amplifier output terminal. The non-inverting input terminal of the amplifier 38 is connected to ground potential. Also connected to the summing line 40 is one end of each of a plurality of resistors indicated at 42 through 50. The other ends of the resistors are connected to respectively associated taps of the delay line 37. A terminating resistor 51 is connected between the output terminal of the delay line 37 and ground.

The vector generator 36, as noted above, is characterized in providing a staircase voltage to the X deflection plates of CRT 33 and thereby a succession of vector component voltage increments that are effective to deflect the electron beam in the X coordinate over the desired range. Similarly, the vector generator 30 is characterized in responding to the analog voltage produced at the output of D-A converter 5 to produce a succession of vector component voltage increments that are effective to deflect the CRT electron beam in the Y coordinate direction, between positions that have been determined by the minimum/maximum circuitry of FIGS. 3 and 4 to be the minimum and maximum sampled data point values in each of the successive sample periods, as those values are outputted by the recirculating memory 3.

As those skilled in the art will understand, the succession of digitally defined vector component voltage increments in the X and Y coordinate directions do not produce a truly "resultant" single vector, but a series of square corner functions or steps. With enough steps, however, the trace produced by the electron beam on the face of the CRT 33 appears to be smooth and continuous, and a true resultant vector. The introduction of the intermediate steps between the minimum and maximum Y coordinate positions for each sampling period reduces the "dwell time" of the electron beam at the ends of the minimun/maximum segments. As a result, there is a reduction in the "bright spots" incident to dwell time at the minimum/maximum points, and uniformity of brightness of the display is enhanced.

THE OPERATION OF THE APPARATUS OF THE PREFERRED EMBODIMENT

As previously noted, the 10 bit A-D words from A-D converter 2 and representative of the data signal S' being sampled are all compared against the previous minimum and maximum digital representations of the said data signal that were previously determined and stored, respectively, in the flip-flops 7 and 8. If, among all the samples, there is an A-D word that is a new maximum, that new maximum is stored in the maximum flip-flops 7. If it is a new minimum, it is stored in the minimum flip-flops 8.

If, among all the A-D words, there is neither a new maximum, nor a new minimum, the flip-flops 7 and 8, respectively, retain their previous maximum and minimum values. Thus, the circuitry of FIGS. 3 and 4 produces two data points, a minimum and a maximum, per sample period. The circuitry of FIGS. 3 and 4 is further characterized, however, in its ability to control which of the two data points is loaded onto the recirculating memory 3. In this connection, in the operation of the circuit of FIG. 4, the following actions occur:

1. The flip-flop 15 sets if a high or a logical 1 signal is applied to its S input terminal from the output of AND gate 11, indicating that a maximum value was found during the sample period. The flip-flop 15 is reset at the end of the sample period by a high or logical 1 signal applied to the R terminal of the flip-flop from circuit 6.

2. The flip-flop 16 sets if a high or a logical 1 is applied to its S input from the output of AND gate 13, indicating that a minimum value was found during the sample period. At the end of the sample period, a high or a logical 1 signal is applied from circuit 6 to the R terminal to reset the flip-flop 16.

3. Latch 20 is clocked when flip-flop 15 or flip-flop 16 sets. It provides an indication of whether the minimum or the maximum value was found first during that period.

4. The MINNEXT output of flip-flop 25 will be set to a logical 0 at the end of the sample period if flip-flop 16 indicates a minimum value occurred during the sample period and the signal SELMIN - 1 (select the minimum value) at the output of inverter 24 is a logical 0, indicating that a maximum value will be loaded into the memory 3. The signal at MINNEXT - 0 will guarantee that the minimum value stored in flip-flop 8 will be serviced during the next sample period and loaded into the memory 3.

5. The MAXNEXT FLIP-FLOP output of flip-flop 25 will similarly be set to a logical 0 if at the end of the said sample period a minimum value is loaded into the memory 3, the pulse at SELMIN - 1 being a logical 1, and if a maximum value also was sensed, as indicated by the setting of the flip-flop 15. In the next sample period a maximum value will then be loaded into the memory 3.

6. If MAXNEXT - 0 is called for, the word in the flip-flops 7 will not be cleared.

7. If MINNEXT - 0 is called for, the word in the flip-flops 8 will not be cleared.

The following is a truth table for the circuit of FIG. 4 that determines whether a minimum value or a maximum value is to be loaded into the memory 3. The abbreviation "d.c." means —don't care—. Each case is explained below the truth table.

| | | INPUTS | | | | OUTPUT |
|---|---|---|---|---|---|---|
| CASE NO. | FLIP-FLOP 16 NEW MIN-1 | FLIP-FLOP 15 NEW MAX-1 | LATCH 20 MAX FIRST-1 | MINNEXT-0 FLIP-FLOP 25 | MAXNEXT-0 FLIP-FLOP 25 | SELMIN-1 |
| 1. | d.c. | d.c. | d.c. | 0 | 0 | d.c.* |
| 2. | d.c. | d.c. | d.c. | 0 | 1 | 1 |
| 3. | d.c. | d.c. | d.c. | 1 | 0 | 0 |
| 4. | 0 | 0 | 0 | 1 | 1 | 1 |
| 5. | 0 | 0 | 1 | 1 | 1 | 0 |
| 6. | 0 | 1 | 0 | 1 | 1 | d.c.* |
| 7. | 0 | 1 | 1 | 1 | 1 | 0 |
| 8. | 1 | 0 | 0 | 1 | 1 | 1 |
| 9. | 1 | 0 | 1 | 1 | 1 | d.c.* |
| 10. | 1 | 1 | 0 | 1 | 1 | 1 |
| 11. | 1 | 1 | 1 | 1 | 1 | 0 |

*Impossible Condition

CASE 1

This case is impossible since MINNEXT - 0 flip-flop 25 and MAXNEXT - 0 flip-flop 24 cannot be set at the same time.

CASE 2

MINNEXT - 0 output of flip-flop 25 introduces or selects a new minimum value for loading into the memory 3.

CASE 3

MAXNEXT - 0 output of flip-flop 25 introduces or selects a new maximum value for loading in the memory 3.

CASE 4

Latch 20 indicates the last value was a minimum value from a previous sample period, and selects a new minimum value for loading in the memory 3.

CASE 5

Latch 20 indicates the last value was a maximum value from a previous sample period, and selects a new maximum value for loading in the memory 3.

CASE 6

This case is impossible since flip-flop 15 indicates a maximum value came in during this sample period and latch 20 indicates the last value received was a minimum value.

CASE 7

Flip-flop 15 indicates a maximum value was received during this sample period and a maximum value is selected for storing in memory 3.

CASE 8

Flip-flop 16 indicates a minimum value was received during this sample period. A minimum value is selected for storing in the memory 3.

CASE 9

This case is impossible since flip-flop 16 indicates a minimum value came in during this period and latch 20 indicates the last value received was a maximum value.

CASE 10

Flip-flops 16 and 15 indicate both a minimum and a maximum value were received in this period. Latch 20 indicates the minimum value came in first, hence, a minimum value is selected for storing in memory 3.

CASE 11

Flip-flops 16 and 15 indicate both minimum and maximum values were received in this sampling period. Latch 20 indicates the maximum value came in first so a maximum value is selected for storing in memory 3.

Examination of the illustrative cases discussed above shows that a request held over from a previous sample period for the display of a maximum or a minimum value will be given first priority. If there is no such request, the latch 20 will be used to determine whether a minimum or a maximum value was first detected and that will be stored in memory 3 for display. It should be noted, with respect to a high frequency signal such as signal S1 both a new minimum and a new maximum value will be detected each period. Referring to FIG. 4, with flip-flops 15 and 16 both set, NAND gates 17 and 18 will both have a logical 1 on their upper input terminals. If the output of inverter 24, SELMIN - 1, is a logical 1 indicating a minimum value is being selected, NAND gate 17 will cause the MAXNEXT output of flip-flop 25 to be set. On the next sample period, SELMIN - 1 will be a logical 0 since said MAXNEXT output is a logical 0. This will cause NAND gate 18 to set the MINNEXT - 0 output of flip-flop 25.

Thus, with high frequency data, it will be seen that the circuits of FIGS. 3 and 4 will store a minimum value in one sample period and a maximum value in the next sample period. In effect, the circuit will draw the envelope of the signal. For very high frequencies, this is what is desired.

By way of illustration and example and not limitation, it is noted that the several components or devices shown in symbolic form in FIGS. 3 and 4 may, if desired, be of the commercially available types listed below:

| | |
|---|---|
| A-D Converter 2 | Burr Brown ADC 85C-10 |
| Recirculating Memory 3 | Signetics 2505 |
| Buffer 4 | National DM8095 |
| D-A Converter 5 | Burr Brown DAC 60-10 |
| Flip-Flops 7 and 8 | Texas Instruments Inc. Serial No. 74174 |
| SUBTRACT Circuit 9 | Texas Instruments Inc. Serial No. 74283 |
| SUBTRACT Circuit 10 | Texas Instruments Inc. Serial No. 74283 |
| AND Gates 11, 13 and 28 | Texas Instruments, Inc. Serial No. 7408 |
| NAND Gates 12, 14, 17, 18, 22 and 23 | Texas Instruments, Inc. Serial No. 7400 |
| Flip-Flops 15 and 16 | Texas Instruments, Inc. Serial No. 74279 |
| Flip-Flops 20 and 25 | Texas Instruments, Inc. Serial No. 7474 |
| OR Gates 19 and 21 | Texas Instruments, Inc. Serial No. 7432 |
| INVERTER 24 | Texas Instruments, Inc. Serial No. 7404 |

Thus, there has been provided in accordance with the present invention an improved digital apparatus for providing a faithful visual reproduction on a vector CRT display device of high frequency signals, and for displaying signal envelopes of high frequency signals. This result is achieved in a manner such that the size of the memory required is minimized and at the same time uniformity of brightness of the visual display is enhanced.

The embodiments of the invention in which an exclusive property or privilege is claimed are defined as follows:

1. The method of providing a faithful digital representation of the amplitude variations of an analog signal comprising deriving in each of successive sampling periods two digital words representative, respectively, of minimum and maximum values of said signal during such sampling period, determining which of said values is most relevant to faithful representation of said signal, storing said most relevant value and discarding the other of said when only one of the said values represent a new maximum and a new minimum value, and storing both of said values in the order derived when both represent new minimum and maximum values and, hence, are relevant values, storing in said sampling period the first value derived in storing the other value in the next successive sampling period, and reading out said stored values in the order in which they were stored.

2. The method as specified in claim 1 wherein voltage vector component increments are derived from said stored values as read out and wherein said voltage vector component increments are applied to a visual display device.

3. Apparatus for producing an indication of the variations of a data signal, comprising:
first means connected to the source of the signal for deriving in each of successive periods two digital words representing, respectively, the minimum value and the maximum value of the amplitude variations of said signal in each of said periods, and second means connected to said first means for producing in each of successive periods a first vector component voltage the magnitude of which is determined by the difference between said minimum and maximum values in a preceding period and a second vector component voltage of substantially constant value,
and third means connected to said second means to indicate the effective resultant of said first and second vector voltage components.

4. Apparatus as specified in claim 3 wherein said second vector component voltage is representative of a time base.

5. Apparatus as specified in claim 3 wherein said third means includes means further to provide a visual display, in seriatim, of the said succession of resultant vector component voltages and thereby of the variations in amplitude over a period of time of said data signal.

6. Apparatus as specified in claim 5 wherein said means to provide a visual display, in seriatim of the said succession of resultant vector component voltages includes a CRT having a display screen and an electron beam, and means to direct the movement of said electron beam over the surface of said screen under control of said succession of resultant component voltages.

7. Apparatus for producing a display of the variations in amplitude of a data signal with respect to a time base by deflecting an electron beam upon the screen of a cathode ray tube comprising:
first means having an input and an output, said input being connected to the source of the signal and operative to produce in said output in said successive periods two digital words representing, respectively, a minimum amplitude value data point and a maximum amplitude value data point of said signal in each of said periods,
recirculating memory means having an input connected to receive the digital words produced in the output of said first-mentioned means and arranged to store, in sequence, a predetermined number of said digital words produced in said successive periods, said memory means having an output and arranged cyclically to provide, in sequence, at said output all of said stored digital words, the first stored digital word being dropped off at the output and a new digital word being added at the input of said memory means from said first-mentioned means at the end of each cycle,
a digital to analog converter connected to the output of said memory means,
means synchronized with the outputting of digital words by said memory means after conversion by said digital to analog converter to produce in each of successive periods first vector component voltage increments acting on said electron beam in a predetermined direction and each increment having a magnitude determined by the difference between the minimum value data point and the maximum value data point of said signal, said last-mentioned means including means to produce second vector component voltage increments each having a substantially constant magnitude to deflect said electron beam in a direction substantially at a right angle with respect to said predetermined direction to represent said time base, whereby said electron beam is caused to move across the surface of said screen in accordance with the variations in amplitude with time of said signal.

8. Apparatus as specified in claim 7 including sorting means connected between the output of said first-mentioned means and the input of said recirculating memory and operative to sort through all of the digital words produced at the output of said first-mentioned means to determine which of the data points in each of the said successive periods is most relevant and must be stored in said memory means for a faithful display of said data signal and further to determine whether the remaining data point can be discarded or must be retained for such display, whereby to minimize the number of digital words requiring storage in said memory for faithful display of said data signal.

9. Apparatus as specified in claim 8 wherein said data sorting means includes first and second storage devices in which data words representative of the minimum amplitude and the maximum amplitude values, respectively, of said data points in an immediately previous one of said successive periods have been stored, comparison means to compare the digital words outputted by said first-mentioned means against the previous minimum and maximum amplitude values of said data points that have been stored in said first and second storage devices, said comparison means including means to effect a subtraction of the successive new minimum and maximum digital words and the corresponding digital words stored in said first and second storage devices, a new digital word being stored in said first-mentioned storage device if said new digital word represents a new minimum amplitude data point of said signal and a new digital word being stored in said second-mentioned storage device if said new digital word represents a new maximum amplitude data point of said signal, said first and second storage devices otherwise retaining their previously stored digital words, said comparison means including a logic circuit that is operative in the presence of both new minimum and maximum data point values of said signal to determine which of said two data points is to be loaded into the recirculating memory, said logic circuitry including a first flip-flop connected to said comparison circuit, said first flip-flop being set if a minimum value data point is found during the sample period, a second flip-flop connected to said comparison circuit, said second flip-flop being set if a maximum value data point is found during said sample period, said first and second flip-flops being reset at the end of each sample period, a latch, an OR gate connecting the outputs of said first and second flip-flops to the clock terminals of said latch, the D terminal of said latch being connected to an output of said comparison circuit whereby upon clocking of said latch in a sample period the output thereof provides an indication of whether a minimum value data point or a maximum value data point was found first during said last-mentioned sample period, means connected to and responsive to the output of said latch to load the minimum value or maximum value data point that first occurred during the said sample period into said recirculating memory and to set said logic circuitry to provide that the other of said data point values will be loaded into said recirculating memory during the next sample period.

10. A method of generating signals for reproducing an analog signal on a vector cathode ray tube display device comprising the steps of:
   a. generating digital values of said analog signal during a series of sample periods;
   b. comparing the digital value during one sample period with the maximum and the minimum values of the signal during a previous sample period;
   c. storing the maximum signal value generated during said one sample period when said maximum signal value is greater than the maximum signal value during the previous sample period;
   d. storing the minimum signal value generated during said one sample period when the minimum signal value is less than the minimum signal value during the previous sample period;
   e. generating a beam deflection signal for said cathode ray tube display device one component of which uses as a starting value the termination value of said vector component during the previous sample period and said stored maximum value when only a new maximum value is reached in the sample period;
   f. generating a beam deflection signal for said cathode ray tube display device one component of which uses as a starting value the termination value of said vector component during the previous sample period and said stored minimum value when only a new minimum value is reached in the sample period; and
   g. generating a beam deflection signal for said cathode ray tube display device one component of which uses as a starting value the termination value of said vector component during the previous sample period and the first achieved maximum or minimum value during the sample period when a new maximum and a new minimum value are both achieved during the sample period.

11. A method of generating signals for reproducing an analog signal on a vector cathode ray tube display device comprising the steps of:
   a. generating digital values of said analog signal during a series of sample periods;
   b. comparing the digital value during one sample period with the maximum and the minimum values of the signal during a previous sample period;
   c. storing the maximum signal value generated during said one sample period when said maximum signal value is greater than the maximum signal value during the previous sample period;
   d. storing the minimum signal value generated during said one sample period when the minimum signal value is less than the minimum signal value during the previous sample period;
   e. generating a beam deflection signal for said cathode ray tube display device one component of which uses as a starting value the termination value of said vector component during the previous sample period and said stored maximum value when only a new maximum value is reached in the sample period;
   f. generating a beam deflection signal for said cathode ray tube display device one component of which uses as a starting value the termination value of said vector component during the previous sample period and said stored minimum value when only a new minimum value is reached in the sample period; and
   g. generating a beam deflection signal for said cathode ray tube display device one component of which uses as a starting value the termination value of said vector component during the previous sample period and the second achieved maximum or minimum value during the sample period when a new maximum and a new minimum value are both achieved during the sample period.

12. An apparatus for generating signals for reproducing an analog signal on a vector cathode ray tube display device comprising in combination:
   a. an analog to digital converter having input means and output means;
   b. means for coupling an analog input signal to the input of said analog to digital converter;
   c. means for establishing a series of contiguous sample periods;
   d. means coupled to the output of said analog to digital converter for comparing said output during one sample period with the maximum output achieved during the previous sample period;
   e. means coupled to the output of said analog to digital converter for comparing said output during one sample period with the minimum output achieved during the previous sample period;
   f. means responsive to said maximum and minimum comparison means for generating a first signal when only a new maximum is reached during said sample period and for generating a second signal when only a new minimum is reached during said sample period and for generating a third signal when a new maximum and a new minimum are both reached;
   g. means responsive to said first signal for generating a beam deflection signal for said cathode ray tube display device one component of which uses as a starting value the termination value of said vector component during the previous sample period and said stored maximum value when only a new maximum value is reached in the sample period;
   h. means responsive to said second signal for generating a beam deflection signal for said cathode ray tube display device one component of which uses as a starting value the termination value of said vector component during the previous sample period and said stored minimum value when only a new minimum value is reached in the sample period; and
   i. means responsive to said third signal for generating a beam deflection signal for said cathode ray tube display device one component of which uses as a starting value the termination value of said vector component during the previous sample period and the first achieved maximum or minimum value during the sample period when a new maximum and a new minimum value are both achieved during the sample period.

* * * * *